United States Patent
Suwabe

(10) Patent No.: US 7,308,239 B2
(45) Date of Patent: Dec. 11, 2007

(54) RECEIVER FOR RECEIVING AMPLITUDE SHIFT KEYING SIGNAL

(75) Inventor: Sayaka Suwabe, Susono (JP)

(73) Assignee: Yazaki Corporation, Tokyo (JP)

( * ) Notice: Subject to any disclaimer, the term of this patent is extended or adjusted under 35 U.S.C. 154(b) by 707 days.

(21) Appl. No.: 10/828,164

(22) Filed: Apr. 21, 2004

(65) Prior Publication Data

US 2004/0214542 A1    Oct. 28, 2004

(30) Foreign Application Priority Data

Apr. 24, 2003 (JP) .............................. 2003-119803

(51) Int. Cl.
*H04B 1/16* (2006.01)
(52) U.S. Cl. .................................. 455/194.2
(58) Field of Classification Search ................ 375/320; 329/370
See application file for complete search history.

(56) References Cited

U.S. PATENT DOCUMENTS 5,319,191 A    6/1994    Crimmins

FOREIGN PATENT DOCUMENTS

JP    5-327794 A    12/1993
JP    2001-36591 A    2/2001

*Primary Examiner*—David C. Payne
*Assistant Examiner*—Leon Flores
(74) *Attorney, Agent, or Firm*—Sughrue Mion Pllc.

(57) ABSTRACT

A receiver for receiving an amplitude shift keying signal includes: a threshold signal generating circuit that has a first diode to which a received amplitude shift keying signal is inputted and generates a threshold signal which practically follows a peak value of the amplitude shift keying signal; an input circuit including a second diode to which a received amplitude shift keying signal is inputted; a first comparator to which the amplitude shift keying signal that is outputted from the input circuit through the second diode is inputted, the first comparator acting with the threshold signal that is outputted from the threshold signal generating circuit through the first diode as a first threshold; a detection circuit for detecting output from the first comparator; and a second comparator to which output from the detection circuit is inputted, the second comparator acting with a second threshold that is a predetermined fixed value.

12 Claims, 6 Drawing Sheets

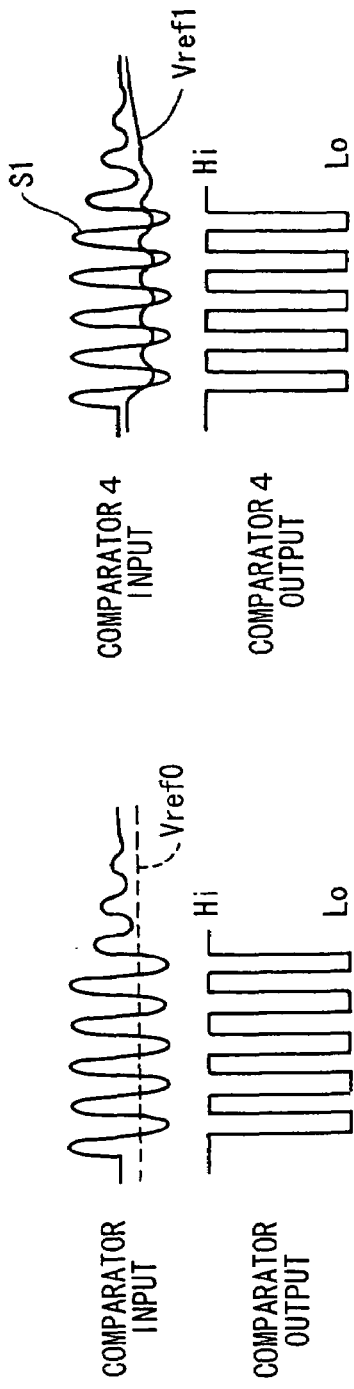
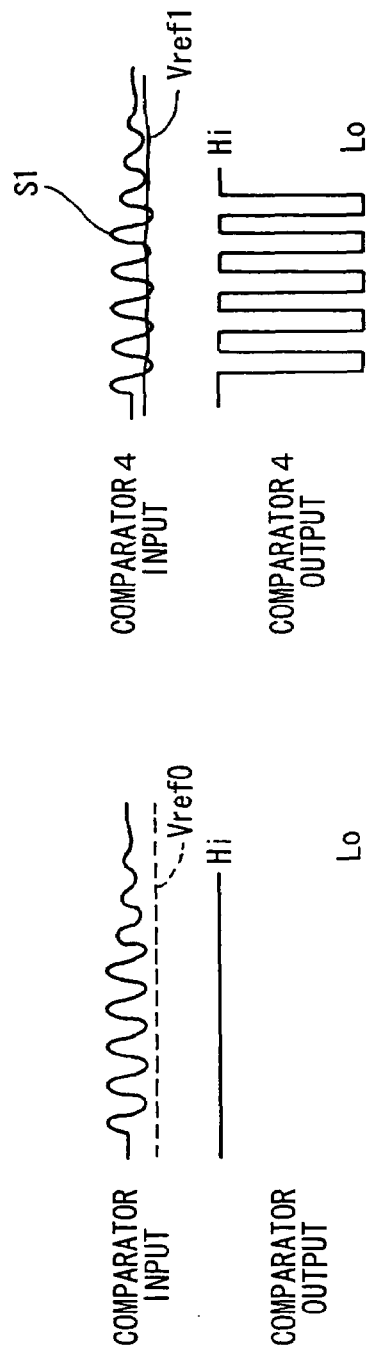

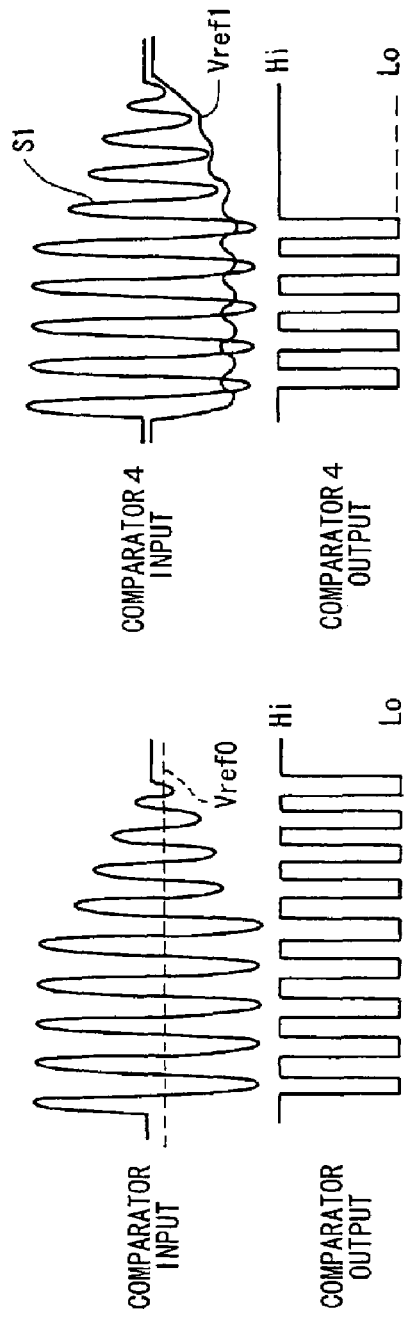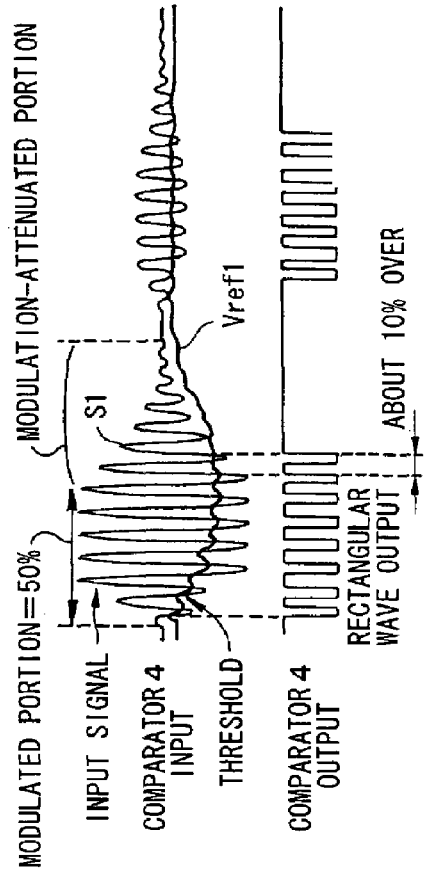

RECEIVER FOR RECEIVING AMPLITUDE SHIFT KEYING SIGNAL

BACKGROUND OF THE INVENTION (1) Field of the Invention

The present invention relates to a receiver for receiving an amplitude shift keying signal (ASK signal).

(2) Description of the Related Art

As a conventional technology for receiving an ASK signal, there has been proposed a technology, in which a clock extract circuit of data carrier for receiving a signal subjected to ASK modulation, that is, a resonance circuit for receiving an ASK signal is connected to a full-wave rectifying circuit, then its output is discriminated with a threshold (i.e. threshold value) near to a peak value by using a comparator, then the discriminated output is provided to charge and discharge circuit, a time constant of which is selected to be about a carrier frequency, and then the output from the charge and discharge circuit is discriminated by a comparator, thereby extracting a clock (for example, see Japanese Patent Application Laid-Open No. H5-327794).

Further, as another conventional technology for receiving an ASK signal, there has been proposed a technology, in which a received signal is amplified by an amplifier, then the amplified signal is inputted into a comparator having an adjustable threshold, thereby outputting high-frequency rectangular wave from the comparator (for example, see Japanese Patent Application Laid-Open No. 2001-36591).

However, in the former, upon providing the signal to the comparator the threshold is a fixed value, therefore when the level of the signal changes, its way of influencing the threshold changes, thereby causing a problem that the output from the comparator is changed.

In the latter, when the inputted signal is weak (for example, several tens of mV), if the frequency of the signal is high (for example, equal to or higher than 100 kHz), it causes a problem of insufficient gain of an amplifier, thereby not enabling amplification with an amplifier having a simple circuit construction, needing high-performance components or a complicated circuit construction, thereby causing a problem of an increase in electric current consumption.

SUMMARY OF THE INVENTION

It is therefore an objective of the present invention to solve the above problems and to provide a receiver for receiving an ASK signal, which receiver acts excellently even if the ASK signal to be received is weak.

In order to attain the above objective, the present invention is to provide a receiver for receiving an amplitude shift keying signal comprising:

a threshold signal generating circuit that includes a first diode to which a received amplitude shift keying signal is inputted and generates a threshold signal which practically follows a peak value of the amplitude shift keying signal;

an input circuit including a second diode to which a received amplitude shift keying signal is inputted;

a first comparator to which the amplitude shift keying signal that is outputted from the input circuit through the second diode is inputted, the first comparator acting with the threshold signal that is outputted from the threshold signal generating circuit through the first diode as a first threshold;

a detection circuit for detecting output from the first comparator; and a second comparator to which output from the detection circuit is inputted, the second comparator acting with a second threshold that is a predetermined fixed value.

With the construction described above, since the receiver for receiving an ASK signal comprises: a threshold signal generating circuit that includes a first diode to which a received amplitude shift keying signal is inputted and generates a threshold signal which practically follows a peak value of the amplitude shift keying signal; an input circuit including a second diode to which a received amplitude shift keying signal is inputted; a first comparator to which the amplitude shift keying signal that is outputted from the input circuit through the second diode is inputted, the first comparator acting with the threshold signal that is outputted from the threshold signal generating circuit through the first diode as a first threshold; a detection circuit for detecting output from the first comparator; and a second comparator to which output from the detection circuit is inputted, the second comparator acting with a second threshold that is a predetermined fixed value, therefore demodulated output can be obtained with a simple circuit construction of low consumption of electric current even for a weak ASK signal, wherein its output waveform is stable with respect to a change in signal amplitude.

Preferably, the threshold signal generating circuit further includes a first resistance and a first capacitor, which are in parallel connected to between the first diode and one of power source electric potentials, and the input circuit further includes a second resistance that is connected to between the second diode and the one of power source electric potentials.

With the construction described above, since the threshold signal generating circuit further includes a first resistance and a first capacitor, which are in parallel connected to between the first diode and one of power source electric potentials, and the input circuit further includes a second resistance, which is connected to between the second diode and the one of power source electric potentials, therefore an appropriate received ASK signal and appropriate threshold signal that practically follows the ASK signal can be provided to both of the input terminals of the first comparator.

Preferably, the first and second diodes have the same temperature characteristic.

With the construction described above, since the first and second diodes have the same temperature characteristic, therefore a demodulated output waveform that is stable with respect to a change in circumferential temperature can be obtained.

Preferably, the first and second diodes have the same forward voltage.

With the construction described above, since the first and second diodes have the same forward voltage, therefore even a weak ASK signal of the order of several tens of mV can be demodulated.

Preferably, a time constant of the threshold signal generating circuit is set so that the threshold signal is applied only on a modulated portion of an amplitude shift keying signal to be received.

With the construction described above, since a time constant of the threshold signal generating circuit is set so that the threshold signal is applied only on a modulated portion of an amplitude shift keying signal to be received, therefore a demodulated output waveform without a time delay can be obtained.

BRIEF DESCRIPTION OF THE DRAWINGS

FIGS. 3A and 3B illustrate actions of the receiver for receiving an ASK signal shown in FIG. 1, wherein (A) input and output waveforms on a conventional comparator having a fixing-type threshold and (B) input and output waveforms on the comparator 4 in the receiver for receiving an ASK signal shown in FIG. 1;

FIGS. 4A and 4B illustrate actions of the receiver for receiving an ASK signal shown in FIG. 1, wherein (A) input and output waveforms on a conventional comparator having a fixing-type threshold and (B) input and output waveforms on the comparator 4 in the receiver for receiving an ASK signal shown in FIG. 1;

FIGS. 5A and 5B illustrate actions of the receiver for receiving an ASK signal shown in FIG. 1, wherein (A) input and output waveforms on a conventional comparator having a fixing-type threshold and (B) input and output waveforms on the comparator 4 in the receiver for receiving an ASK signal shown in FIG. 1;

FIG. 6 illustrates a method of setting a time constant in a threshold signal generating circuit 2 in the receiver for receiving an ASK signal shown in FIG. 1;

DESCRIPTION OF THE PREFERRED EMBODIMENTS

Figure 1:
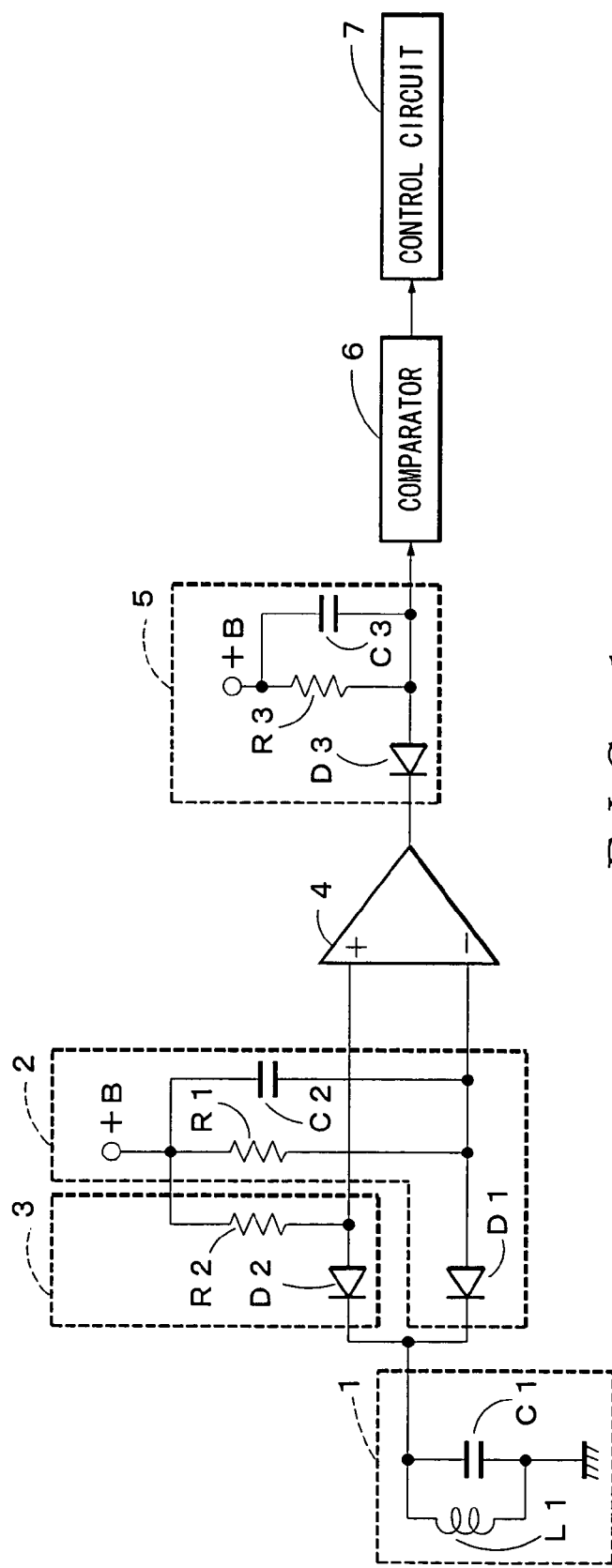
FIG. 1 is a circuit diagram illustrating a preferred embodiment of a receiver for receiving an ASK signal according to the present invention.

In the following, the preferred embodiments of the present invention will be explained with reference to the attached drawings. FIG. 1 is a circuit diagram illustrating a preferred embodiment of a receiver for receiving an ASK signal according to the present invention. The receiver 1 for receiving an ASK signal includes a resonance circuit 1, threshold signal generating circuit 2, input circuit 3, comparator 4, detection circuit 5, comparator 6, and control circuit 7.

The resonance circuit 1 includes a coil L1 and capacitor C1, which are connected to each other in parallel, and receives a weak ASK signal transmitted from a transmitting side being ASK-modulated with predetermined transmission data.

The threshold signal generating circuit 2 includes a diode D1, resistance R1, and capacitor C2, wherein a cathode of the diode D1 is connected to the resonance circuit 1, while the resistance R1 and capacitor C2 are in parallel connected to between an anode of the diode D1 and one of power source electric potentials of a +B power source, that is, a plus electric potential of the +B power source.

The input circuit 3 includes a diode D2 and resistance R2, wherein a cathode of the diode D2 is connected to the resonance circuit 1, while the resistance R2 is connected to between an anode of the diode D2 and one of power source electric potentials of a +B power source, that is, a plus electric potential of the +B power source. The diode D2 is situated within the same package with the diode D1 of the threshold signal generating circuit 2, having the same forward voltage and the same temperature characteristic as those of the diode D1.

The comparator 4 includes an operational amplifier, an inversion input terminal of which is connected to an anode of the diode D1, while a non-inversion input terminal of which is connected to an anode of the diode D2. When the received ASK signal is not inputted from the resonance circuit 1, the inversion and non-inversion input terminals of the comparator 4 are set so that a slight offset voltage (for example, 10 mV) is generated between the two terminals.

The detection circuit 5 includes a diode D3, resistance R3 and capacitor C3, wherein a cathode of the diode D3 is connected to an output terminal of the comparator 4, while an anode of the diode D3 is connected to an input terminal of the comparator 6, and the resistance R3 and capacitor C3 are in parallel connected to between an anode of the diode D3 and a +B power source.

In the following, an action of the receiver for receiving an ASK signal having the construction described above will be explained.

Figure 2A:
FIGS. 2A-2E illustrate signal waveforms on respective sections in the circuit diagram shown in FIG. 1, wherein (A) an output waveform on a resonance circuit 1, (B) an input waveform for both of input terminals on a comparator 4, (C) an output waveform on the comparator 4, (D) an output waveform on a detection/smoothing circuit 5, and (E) an output waveform on the comparator 6.

When a weak ASK signal that is ASK-modulated as shown in FIG. 2A is received, it is provided to the threshold signal generating circuit 2 and to the input circuit 3.

Figure 2B:
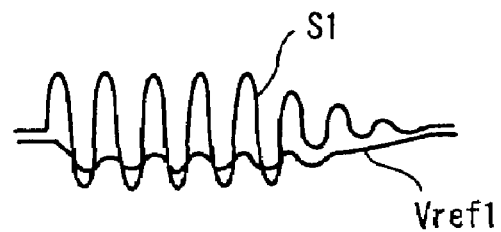

As shown in FIG. 2B, the input circuit 3 provides an ASK signal S1, which is level-shifted by a factor of a voltage drop occurred in the diode D2, to the non-inversion input terminal of the comparator 4.

As shown in FIG. 2B, the threshold signal generating circuit 2 generates a threshold signal Vref1, which practically follows a peak value located on the lower side of the ASK signal S1 that is provided to the non-inversion input terminal of the comparator 4, then provides the threshold signal Vref1 to the inversion input terminal of the comparator 4 as a threshold of the comparator 4.

Figure 2C:
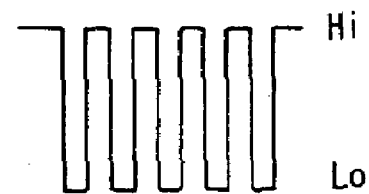

The comparator 4 compares the ASK signal S1 that is provided to the non-inversion input terminal thereof with the threshold signal Vref1 that is provided to the inversion input terminal thereof, then outputs a rectangular wave signal as shown in FIG. 2C.

That is, a signal outputted from the comparator 4 is a signal, in which a carrier part of the received ASK signal is transformed to a rectangular wave, and this rectangular wave signal is provided to the detection circuit 5. The detection circuit 5 detects and smoothes the rectangular wave, then outputs a signal shown in FIG. 2D to the comparator 6.

Figure 2D:
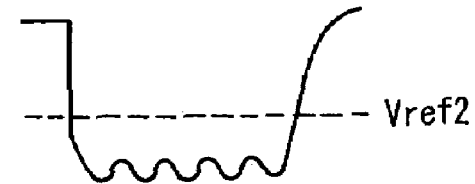
Figure 2E:
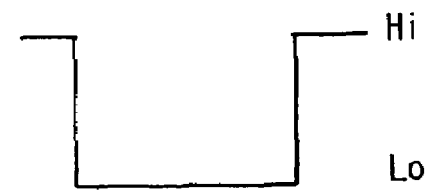

The comparator 6 has a fixed threshold Vref2 as shown in FIG. 2D with respect to its received signal outputted from the detection circuit 5 and outputs a demodulated signal of a rectangular wave as shown in FIG. 2E providing it to the control circuit 6 as received data.

The control circuit 6 performs a specific control on the basis of the received data provided from the comparator 6.

The receiver for receiving an ASK signal according to the present invention acts as described above. A reason why the threshold signal generating circuit 2 is used to input a threshold to the comparator 4 is that when a fixed threshold is used, there might be a case that an input signal is not applied on the threshold upon a change in a level of the input signal. Therefore, a waveform that follows a peak value on the lower side of the input signal is generated by using the threshold signal generating circuit 2 and the waveform is set as a threshold of the comparator 4 so that the threshold always can follow the input signal even when the level of the input signal changes.

That is, for example, with respect to an input waveform of an ASK signal having an appropriate level (i.e. normal voltage amplitude), as shown in FIG. 3A, a rectangular wave signal is obtained as an output from a comparator having a threshold Vref0 of a conventional fixing-type, and as shown in FIG. 3B, a rectangular wave signal is obtained as an output from the comparator 4 having a threshold signal Vref1 that follows an inputted ASK signal of the present invention.

When a waveform of the inputted ASK signal is weak (i.e. when the voltage amplitude being small), as shown in FIG. 4A, the inputted signal is not applied on the threshold Vref0 with a conventional comparator, causing not enabling to obtain a rectangular wave signal as an output. On the other hand, as shown in FIG. 4B, with the comparator 4 of the present invention, since the threshold signal Vref1 follows an ASK signal, therefore the ASK signal is applied on the threshold signal Vref1, thereby obtaining a rectangular wave signal as an output from the comparator 4.

When a waveform of the inputted ASK signal is large (i.e. when the voltage amplitude being large), as shown in FIG. 5A, a rectangular wave signal can be obtained as an output from a conventional comparator, however, since the rectangular wave is outputted on a condition that the number of the waves is increased from the modulated portion to the modulation-attenuated portion to be attenuated, therefore it becomes difficult to be demodulated properly. However, as shown in FIG. 5B, in the comparator 4 of the present invention, since the threshold Vref1 follows so that it is applied on the modulated portion of the ASK signal but not on the modulation-attenuated portion of the ASK signal, therefore an appropriate demodulation can be attained practically without changing the number of the rectangular waves to be outputted.

As is described above, in order to carry out an appropriate demodulation such that the threshold Vref1 follows so that it is applied on the modulated portion of the ASK signal but not on the modulation-attenuated portion of the ASK signal, a time constant in the threshold signal generating circuit 2 is set to be an suitable value in the present invention. In the following, a method of setting such a suitable value will be explained.

Figure 7:
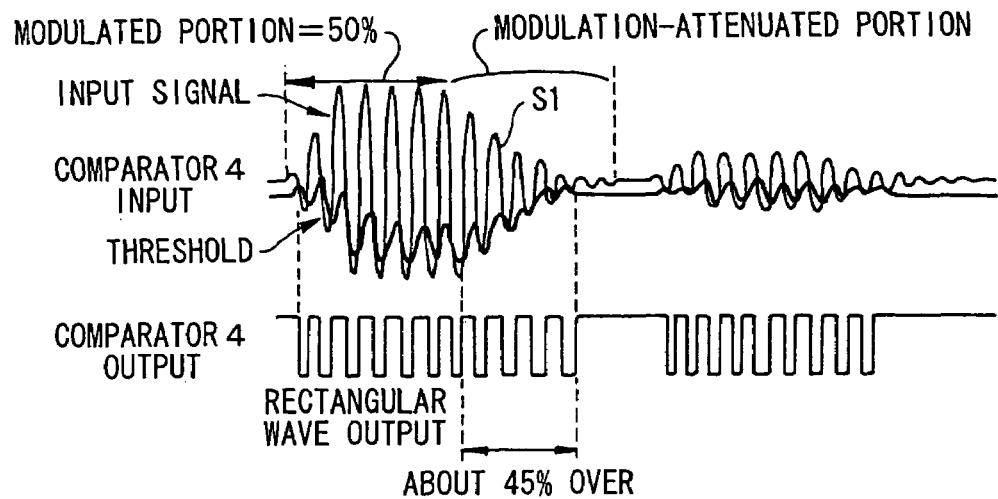
FIG. 7 illustrates a method of setting a time constant in a threshold signal generating circuit 2 in the receiver for receiving an ASK signal shown in FIG. 1.
Figure 8:
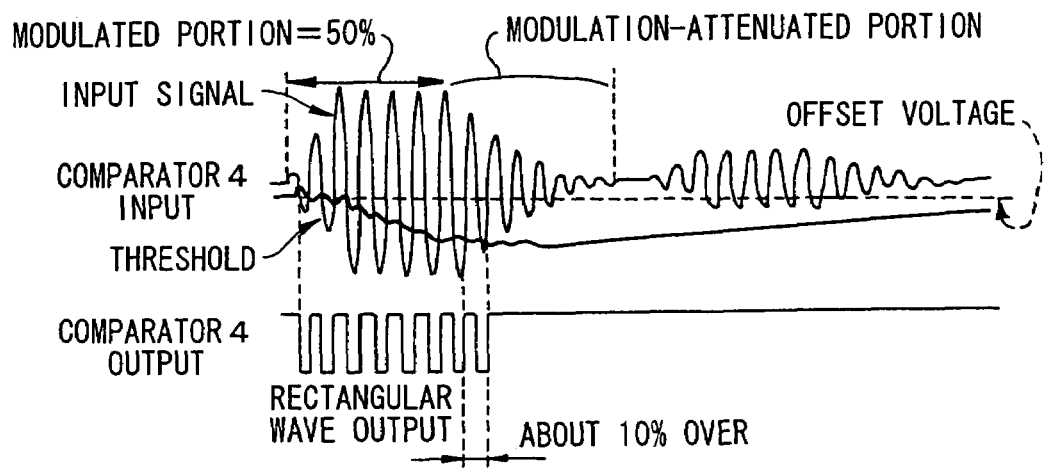
FIG. 8 illustrates a method of setting a time constant in a threshold signal generating circuit 2 in the receiver for receiving an ASK signal shown in FIG. 1.

As an output from the comparator 4, for example, if only the modulated portion of the ASK signal is shaped into a rectangular wave, when the modulated portion possesses 50% of the signal of one period=100% of the inputted ASK signal, an objective would be to shape this modulated 50% portion into a rectangular wave. However, because of a LC-resonance characteristic of the resonance circuit 1 that receives the ASK signal, even after the modulation is finished, the modulated portion of the ASK signal is gradually attenuated as shown in FIGS. 6-8. Here, the attenuated portion except for the modulated portion is called the modulation-attenuated portion.

In order to shape only the original modulated portion except for this modulation-attenuated portion into a rectangular wave, the setting of the time constant, which is determined by a resistance value of the resistance R1 and a capacity value of the capacitor C1 in the threshold signal generating circuit 2 that determines the threshold of the comparator 4, is delayed compared to the inputted ASK signal, thereby enabling that the threshold is not applied on the modulation-attenuated portion.

Such examples of setting the time constant are shown below:

the time constant of the threshold signal generating circuit 2 in FIG. 6=700 pF (capacity value of C1)×200 kΩ (resistance value of R1)=0.14 msec;

the time constant of the threshold signal generating circuit 2 in FIG. 7=1000 pF (capacity value of C1)×200 kΩ (resistance value of R1)=0.2 msec; and the time constant of the threshold signal generating circuit 2 in FIG. 8=0.04 µF (capacity value of C1)×200 kΩ (resistance value of R1)=8 msec.

In the setting of the time constant in FIG. 6, the threshold signal Vref1 is applied on the first period of the carrier of the modulated portion while it follows the signal avoiding the modulation-attenuated portion practically, therefore enabling to output the rectangular wave having an amount of nearly the objective 50% (being over by 10%).

In the setting of the time constant in FIG. 7, since the setting of the time constant is short, therefore the threshold signal Vref1 follows so that it is even applied on the modulation-attenuated portion, thereby outputting a rectangular wave with regard to the modulation-attenuated portion besides to the modulated portion that is necessary originally and exceeding considerably the objective output (exceeding by about 45%). Consequently, the demodulated output obtained from the comparator 6 becomes a waveform having a time delay.

In the setting of the time constant in FIG. 8, the delay of setting of the time constant is long, therefore a discharge period of time of the capacitor C1 becomes long. Consequently, when the inputted ASK signal changes from a large signal amplitude to a small signal amplitude, it takes a time for the threshold signal Vref1 to recover back to the original offset voltage value, thereby causing not enabling to follow the subsequent signal having a small amplitude. That is, it becomes impossible to obtain a demodulated output form the comparator 6.

Accordingly, an appropriate method of setting the time constant of the threshold signal Vref1 is the setting as shown in FIG. 6, in which the threshold signal Vref1 is applied only on the modulated portion and not on the modulation-attenuated portion, and the threshold signal Vref1 can be recovered back to the offset voltage value until a modulated waveform of the subsequent period is inputted.

The following is a reason why the diodes D1 and D2 are connected with regard to signals which are inputted to the inversion input terminal and non-inversion input terminal of the comparator 4.

That is, the diode D1 used for the threshold signal generating circuit 2 on the side of the threshold input is an element which is necessary to generate a threshold signal that practically follows the peak value of the ASK signal to be received. However, in the diode D1, its forward voltage value changes being affected by a change in the circumferential temperature and as a result, the offset voltage of the threshold changes. Because of this change in the offset voltage, the threshold is not applied on the ASK signal inputted to the non-inversion input terminal of the comparator 4, and a rectangular wave might not be outputted from the comparator 4. Therefore, a diode D2 that is packaged in the same package as the diode D1 and has the same temperature characteristic as the diode D1 is connected to the non-inversion input terminal of the comparator 4 so that both of the ASK signal provided to both input terminals of the comparator 4 and the threshold signal are changed similarly in response to the circumferential temperature, thereby the offset voltage between both input terminals of the comparator 4 is maintained constant and the circuit is obtained, in which the threshold always can follow the input signal.

Since the diode D2 has the same forward voltage as the diode D1, even if the ASK signal inputted to the non-inversion input terminal of the comparator 4 is as weak as several tens of mV, it exceeds the offset voltage that is set to be ten mV between the inversion input terminal and the non-inversion input terminal, therefore an output of a rectangular wave can be obtained from the comparator 4.

That is, if the forward voltage of the diode D2 is different from that of the diode D2 or if the diode D2 itself is not connected to the diode D1, the offset voltage increases by a factor of the difference between both values of the forward voltage or a factor of the forward voltage of the diode D1, respectively, causing not enabling to demodulate a weak ASK signal of several tens of mV. However, there is no such an undesired possibility according to the present invention.

As is explained above, according to the present invention, even when the inputted ASK signal is weak, such a weak ASK signal can be subjected to comparison with a simple construction that the ASK signal is directly provided to the comparator without using an amplifier.

In the present invention, with regard to the ASK signal to be inputted to the comparator 4, a threshold inputting section of the comparator 4 is set to be the threshold signal generating circuit 2 which generates a threshold signal that follows the peak value of the inputted ASK signal. Thereby, since the threshold follows a change in the inputted signal, a stable output of a rectangular wave always can be obtained from the comparator 4.

Further, upon inputting to the comparator 4, since the diode D1 that is used for the threshold signal generating circuit 2 on the side of the threshold input is an element that is affected by a change in temperature, therefore the threshold is changed with a change in circumferential temperature, however, in the present invention, the diode D2 packaged in the same package as the diode D1 is also connected to the ASK signal-input side thereof, thereby both input signals are changed similarly with respect to temperature and the offset voltage between both input terminals of the comparator 4 can be maintained constant.

Therefore, according to the present invention, even when the ASK signal is weak, a demodulated output can be obtained by a simple circuit construction with low consumption of electric current and its output waveform is stable with respect to a change in circumferential temperature and a change in the signal amplitude.

The aforementioned preferred embodiments are described to aid in understanding the present invention and variations may be made by one skilled in the art without departing from the spirit and scope of the present invention.

Figure 9:
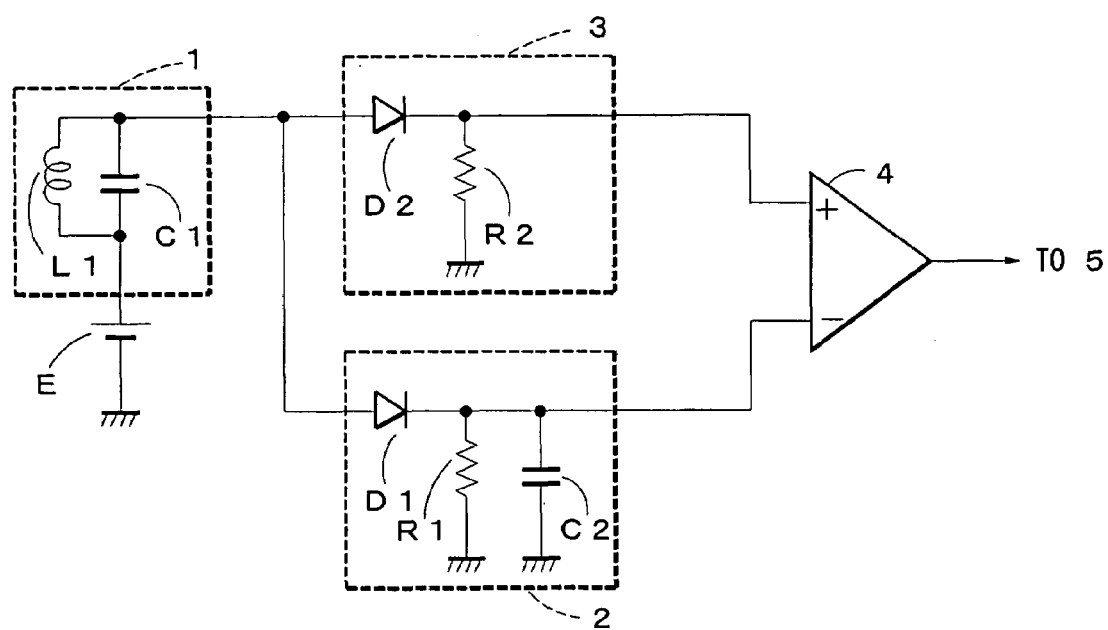
FIG. 9 is a circuit diagram illustrating another preferred embodiment of a receiver for receiving an ASK signal according to the present invention.

For example, as shown in FIG. 9, the polarity of the diodes D1 and D2 may be set inverse of that shown in FIG. 1. In such a case, a direct current voltage source E as a electric source is connected to between the resonance circuit 1 and the ground, the anode of the diode D1 for the threshold signal generating circuit 2 is connected to the resonance circuit 1 while the cathode is connected to the inversion input terminal of the comparator 4, the resistance R1 and the capacitor C2 are in parallel connected to the cathode of the diode D1 and the ground (i.e. power source electric potential on the minus side). Further, the anode of the diode D2 for the input circuit 3 is connected to the resonance circuit 1 while the cathode is connected to the non-inversion input terminal of the comparator 4, and the resistance R2 is connected to between the cathode of the diode D2 and the ground (i.e. power source electric potential on the minus side).

What is claimed is:

1. A receiver for receiving an amplitude shift keying signal comprising:
    a resonance circuit which receives the amplitude shift keying signal which is transmitted from transmitting side;
    a threshold signal generating circuit that includes a first diode to which the received amplitude shift keying signal is input and generates a threshold signal which practically follows a peak value of the amplitude shift keying signal;
    an input circuit including a second diode to which the received amplitude shift keying signal is input;
    a first comparator to which the amplitude shift keying signal is input from the input circuit through the second diode, the first comparator acting with the threshold signal through the first diode as a first threshold;
    a detection circuit for detecting output from the first comparator; and
    a second comparator to which output from the detection circuit is inputted, the second comparator acting with a second threshold that is a predetermined fixed value,
    wherein the first diode and the second diode are disposed in a same package.

2. The receiver according to claim 1, wherein the threshold signal generating circuit further includes a first resistance and a first capacitor, which are connected in parallel between the first diode and a power source electric potential, and wherein the input circuit further includes a second resistance that is connected between the second diode and the power source electric potenial.

3. The receiver according to claim 1, wherein the first and second diodes have the same temperature characteristic.

4. The receiver according to claim 2, wherein the first and second diodes have the same temperature characteristic.

5. The receiver according to claim 3, wherein the first and second diodes have the same forward voltage.

6. The receiver according to claim 4, wherein the first and second diodes have the same forward voltage.

7. The receiver as claimed in any one of claims 1-6, wherein a time constant of the threshold signal generating circuit is set so that the threshold signal is applied only on a modulated portion of an amplitude shift keying signal to be received.

8. The receiver according to claim 1, wherein the amplitude shift keying signal is input to the first comparator without being amplified by an amplifier.

9. The receiver according to claim 1, wherein the first comparator comprises:
    a first input terminal to which the amplitude shift keying signal is input; and
    a second input terminal to which the threshold signal is input.

10. The receiver according to claim 9, wherein an offset voltage between the first input terminal and second input terminal is constant.

11. The receiver according to claim 1, wherein the first diode and the second diode are arranged in the same direction.

12. The receiver according to claim 1, wherein an anode of the first diode is connected to a first input terminal of the first comparator, and an anode of the second diode is connected to a second input terminal of the second comparator.

* * * * *